US011464148B2

United States Patent
Imura (10) Patent No.: US 11,464,148 B2
(45) Date of Patent: Oct. 4, 2022

(54) NOZZLE HOLDING MECHANISM AND COMPONENT MOUNTING DEVICE

(71) Applicant: FUJI CORPORATION, Chiryu (JP)

(72) Inventor: Jinya Imura, Toyoake (JP)

(73) Assignee: FUJI CORPORATION, Chiryu (JP)

( * ) Notice: Subject to any disclaimer, the term of this patent is extended or adjusted under 35 U.S.C. 154(b) by 509 days.

(21) Appl. No.: 16/498,022

(22) PCT Filed: Apr. 19, 2017

(86) PCT No.: PCT/JP2017/015760
§ 371 (c)(1),
(2) Date: Sep. 26, 2019

(87) PCT Pub. No.: WO2018/193559
PCT Pub. Date: Oct. 25, 2018

(65) Prior Publication Data
US 2021/0105919 A1  Apr. 8, 2021

(51) Int. Cl.
*H05K 13/04* (2006.01)
*H05K 13/08* (2006.01)
*B25J 15/04* (2006.01)

(52) U.S. Cl.
CPC ...... *H05K 13/0409* (2018.08); *B25J 15/0441* (2013.01); *H05K 13/0411* (2018.08); *H05K 13/0812* (2018.08)

(58) Field of Classification Search
CPC ............. H05K 13/0409; H05K 13/0812; B25J 15/0441
See application file for complete search history.

(56) References Cited

U.S. PATENT DOCUMENTS

2006/0150404 A1*  7/2006  Van De Ven ...... H05K 13/0409
29/833
2008/0148558 A1  7/2008  Oh

FOREIGN PATENT DOCUMENTS

| JP | 2000-91794 A | | 3/2000 |
|---|---|---|---|
| JP | 2004158658 A | * | 6/2004 |
| JP | 2013-184281 A | | 9/2013 |
| KR | 10-1687021 B1 | | 12/2016 |
| KR | 101687021 B1 | * | 12/2016 |

OTHER PUBLICATIONS

International Search Report dated Jul. 25, 2017 in PCT/JP2017/015760 filed on Apr. 19, 2017.
Extended European Search Report dated Mar. 13, 2020 in corresponding European Patent Application No. 17906710.3, 8 pages.

* cited by examiner

*Primary Examiner* — Livius R. Cazan
(74) *Attorney, Agent, or Firm* — Oblon, McClelland, Maier & Neustadt, L.L.P.

(57) ABSTRACT

A nozzle holding mechanism of the invention is capable of holding multiple types of nozzles to a head of a component mounting device and includes: a magnet provided in a holding section of the head; and a magnetic material, attracted to the magnet, provided in a held section of the nozzle on the side held by the holding section of the head, at a position facing the magnet. The magnetic material is provided so as to have a gap between the magnetic material and the magnet while the nozzle is held by the head. The gap is adjusted to be larger or smaller in accordance with the type of the nozzle held by the head.

4 Claims, 9 Drawing Sheets

| | Nozzle type | | |
|---|---|---|---|
| | Nozzle A | Nozzle B | Nozzle C |
| Weight | Small | Medium | Large |
| Distance from magnet to metal plate (ΔL) | Large | Medium | Small |

NOZZLE HOLDING MECHANISM AND COMPONENT MOUNTING DEVICE

TECHNICAL FIELD

This specification discloses a nozzle holding mechanism and a component mounting device.

BACKGROUND ART

Conventionally, there is a component mounting device in which an electronic component is picked up by a nozzle, operating by a vacuum mechanism and detachably attached to a head, and the picked up electronic component is mounted at a designated position of a circuit board. For example, Patent Literature 1 discloses a component mounting device in which a nozzle is held on a head by a magnetic force. The head of this component mounting device has a permanent magnet for holding the nozzle by magnetic force and an air blowing hole for blowing air toward the nozzle. The attached portion of the nozzle, on the side held by the mounting head, is made of a magnetic material. Therefore, when the nozzle is attached to the head, the attached portion is held by the magnetic force constantly acting from the permanent magnet and the nozzle does not fall. The nozzle is removed by blowing air from the air blowing hole of the head toward the attached portion and separating the nozzle from the head against the magnetic force of the permanent magnet.

PATENT LITERATURE

Patent Literature 1: JP-A-2000-91794

BRIEF SUMMARY

Technical Problem

There are various types of nozzles, and the nozzles are exchanged to suit the components to be picked up as needed. In order to hold many types of nozzles in one type of head, it is necessary to properly set the magnetic force of the magnet so that the nozzle does not fall regardless of which type of nozzle is attached. Under this requirement, the nozzle is held by the head by a holding force obtained by subtracting the weight (i.e., due to gravity) of the nozzle from the magnetic force of the magnet. Therefore, for example, as a magnet, it is conceivable to set the strength of the magnetic force to match with heavy nozzles so that the nozzle does not fall even if the nozzle attached to the head is heavy. However, if the magnetic force of the permanent magnet is increased excessively to match with heavy nozzles, the holding force when the head holds lightweight nozzles becomes stronger than necessary, making it difficult to remove the nozzle from the head.

It is a main objective of the present disclosure to provide a nozzle holding mechanism capable of preventing the nozzle from falling regardless of the type of nozzle attached to the head and capable of easily removing the nozzle when the nozzle is exchanged.

Solution to Problem

The present disclosure employs the following means to achieve the above-mentioned main objective.

The nozzle holding mechanism of the present disclosure is a nozzle holding mechanism capable of holding multiple types of nozzles to a head of a component mounting device, the nozzle holding mechanism including: a magnet provided in a holding section of the head; and a magnetic material, being attracted to the magnet, and provided in a held section of the nozzle on a side held by the holding section of the head, at a position facing the magnet; wherein the magnetic material is provided so as to have a gap between the magnetic material and the magnet while the nozzle is held by the head, and the gap is adjusted to be larger or smaller in accordance with the type of the nozzle held by the head.

In the nozzle holding mechanism of the present disclosure, the magnetic attraction force acting on the holding section of the nozzle is adjusted by adjusting the gap between the magnet provided in the holding section of the head and the magnetic material provided in the held section of the nozzle. As a result, it is possible to prevent nozzles from falling regardless of the type of nozzle attached to the head, and nozzles can be easily removed when nozzles are exchanged.

A component mounting device of the present disclosure includes: the above-mentioned nozzle holding mechanism; a moving device configured to move the head; a strong magnet having a magnetic force stronger than the magnet; and a control device configured to determine whether foreign matter is adhered to the magnet provided in the holding section of the head, and in a case in which it is determined that the foreign matter is adhered to the magnet, control the moving device such that the foreign matter is pulled off by the strong magnet.

In the component mounting device of the present disclosure, even if metallic foreign matter adheres to the magnet provided in the holding section of the head, the foreign matter can be automatically pulled off by the strong magnet, and therefore, when foreign matter adheres to the magnet provided in the holding section of the head, the need for an operator to stop the device and perform cleaning can be eliminated.

DESCRIPTION OF EMBODIMENTS

Next, embodiments of the present disclosure will be described with reference to the drawings.

Figure 1:
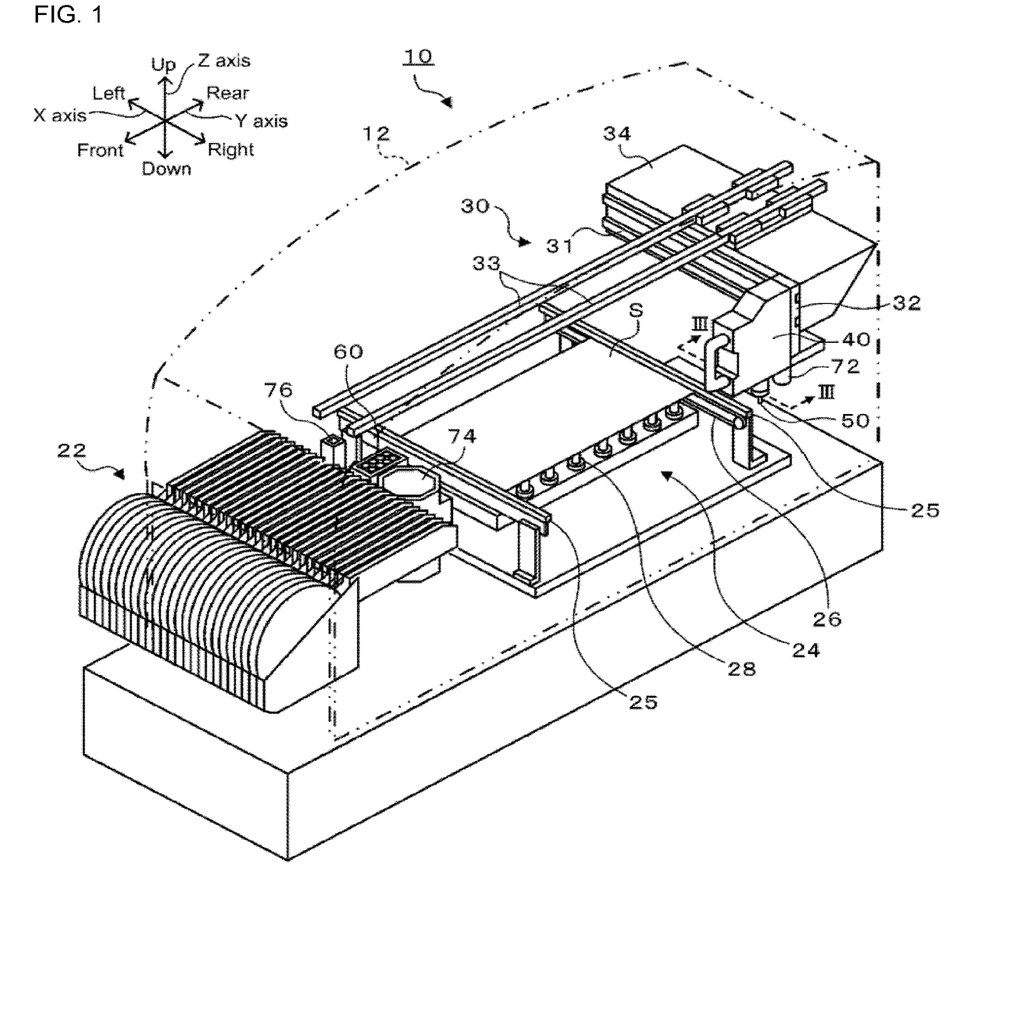
FIG. 1 A diagram showing a configuration of component mounting device 10 according to a present embodiment.
Figure 2:
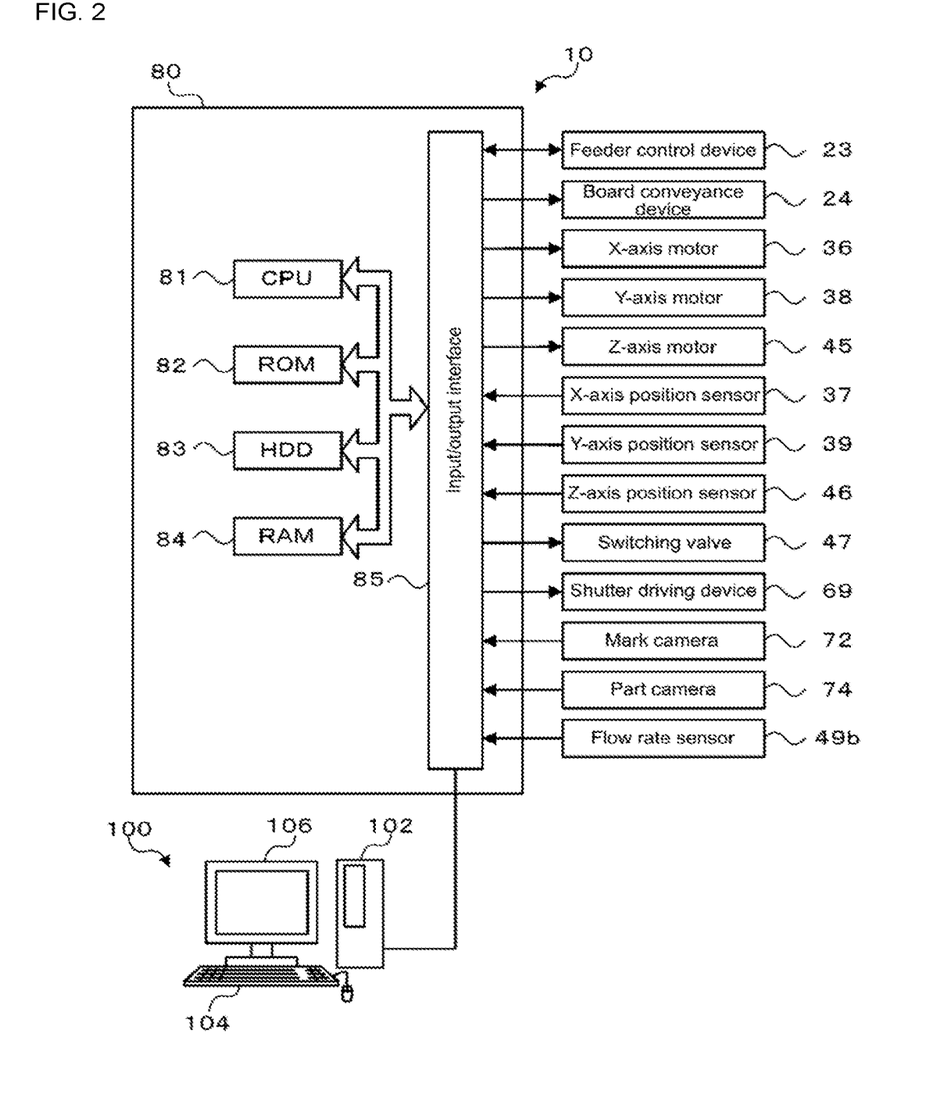
FIG. 2 A diagram showing the electrical connections of component mounting device 10.
Figure 3:
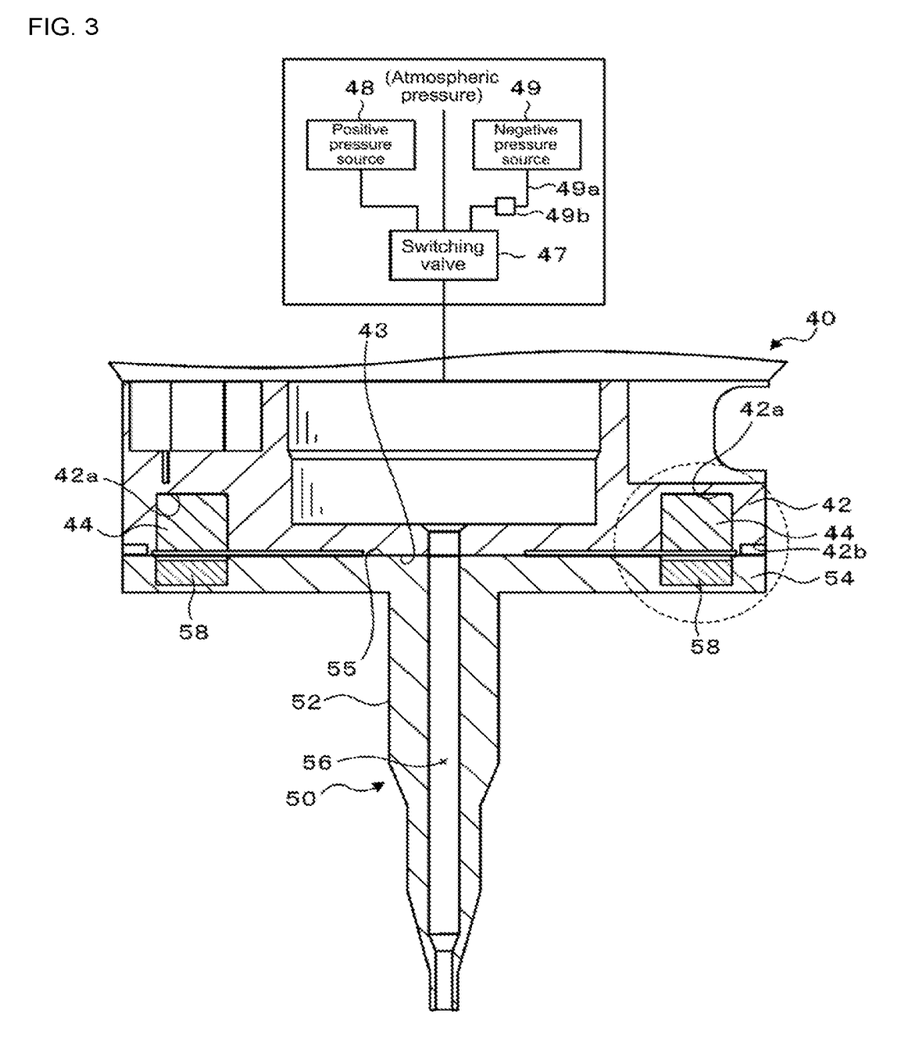
FIG. 3 A cross-sectional view of head 40 and nozzle 50.
Figure 4:
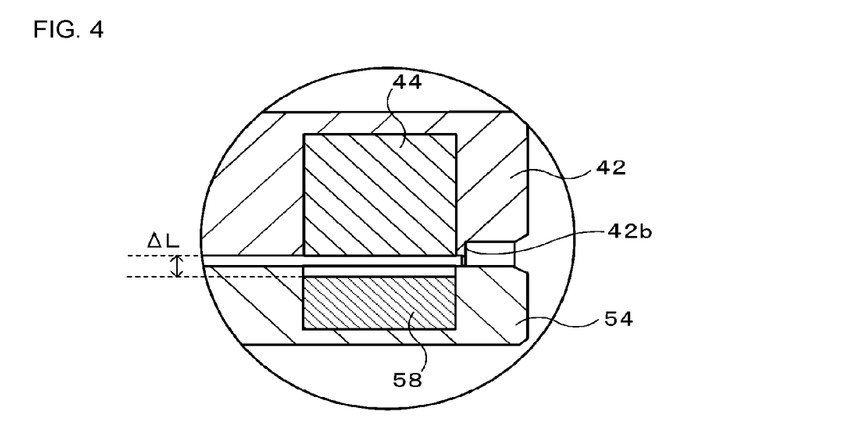
FIG. 4 A partial enlarged view showing the broken line portion of FIG. 3.

FIG. 1 is a diagram showing a configuration of component mounting device 10 of the present embodiment. FIG. 2 is a diagram showing electrical connections of component mounting device 10. FIG. 3 is a cross-sectional view of head 40 and nozzle 50. FIG. 4 is a partial enlarged view of the broken line portion of FIG. 3.

The component mounting device 10 picks up an electronic component (hereinafter referred to simply as "component") and mounts the component on a circuit board (hereinafter referred to simply as "board"). As shown in FIG. 1, component mounting device 10 includes component supply device 22, board transfer device 24, XY robot 30, head 40, nozzle 50, nozzle station 60, mark camera 72, part camera 74, foreign-matter removal magnet 76, and mounting control device 80 (refer to FIG. 2).

Component supply device 22 is detachably attached to a feeder table provided in front of component mounting device 10. Component supply device 22 is, for example, a tape feeder including a reel on which a tape is wound. The tape has multiple recesses at equal intervals along its length. Each recess accommodates a component. These components are protected by a film covering the surface of the tape. The tape feeder draws the tape out of the reel and feeds the tape rearward by a predetermined amount, thereby sequentially supplying the components accommodated in the tape to a component supply position. By peeling off the film before the arrival of components at the component supply position, the components accommodated in the tape are exposed at the component supply position and picked up by nozzle 50.

Board conveyance device 24 includes conveyor belt 26 attached to a pair of front and rear conveyor rails 25 extending in the left-right direction. Board S is conveyed from left to right by conveyor belt 26. Board conveyance device 24 fixes board S, by lifting board S from below with support pins 27 disposed below board S and pressing board S against the guide plate on the upper portion of conveyor rails 25, and releases board S by lowering support pins 27.

XY robot 30 includes X-axis slider 32 and Y-axis slider 34. X-axis slider 32 is slidably attached to a pair of upper and lower guide rails 31 provided on the front face of Y-axis slider 34 and extending in the left-right direction. X-axis slider 32 is attached with X-axis motor 36 (refer to FIG. 2) via a ball screw mechanism and slides along guide rails 31 by driving of X-axis motor 36. Y-axis slider 34 is slidably attached to a pair of left and right guide rails 33 that extend in the front-rear direction and are provided in the upper stage of housing 12 of component mounting device 10. Y-axis slider 34 is attached with Y-axis motor 38 (refer to FIG. 2) via a ball screw mechanism and slides along guide rails 33 by driving of Y-axis motor 38.

Head 40 is detachably attached to the front face of X-axis slider 32 and moves in the XY direction by the driving of XY robot 30 (i.e., X-axis motor 36 and Y-axis motor 38). As shown in FIG. 3, head 40 includes disk-shaped head flange 42 having holding surface 43 for holding nozzle 50 at the lower end thereof. Head flange 42 is connected to Z-axis motor 45 (see FIG. 2) via a ball screw mechanism and slides (i.e., moves up and down) in the up-down direction by driving Z-axis motor 45. Holding surface 43 of head flange 42 is provided with multiple, for example, two, recesses 42a. Permanent magnet 44 is embedded in each recess 42a. Annular groove 42b into which a part of shutter 65, which will be described later, enters from the side is formed around holding surface 43 of head flange 42.

Nozzle 50 is exchangeably attached to holding surface 43 of head flange 42 so as to be suitable for the type of the component to be picked up and the type of board S to be mounted. As shown in FIG. 3, nozzle 50 includes nozzle main body 52 and disk-shaped nozzle flange 54 integrally molded with the upper end of nozzle main body 52, and an air flow path 56 is formed in nozzle main body 52 so as to penetrate nozzle 50 in the up-down direction along the central axis. Air flow passage 56 is connected to positive pressure source 48, negative pressure source 49, and an opening to the atmosphere via switching valve 47 so that negative pressure, positive pressure, or atmospheric pressure is selectively supplied by being driven by switching valve 47. The upper face of nozzle flange 54 is held surface 55 which is held by holding surface 43 of head flange 42. Metal plate 58 serving as a magnetic material is embedded in held surface 55 of nozzle flange 54 at a position facing permanent magnet 44. Metal plate 58 is formed of, for example, an iron-based material consisting of iron, cobalt, or nickel.

Figure 5:
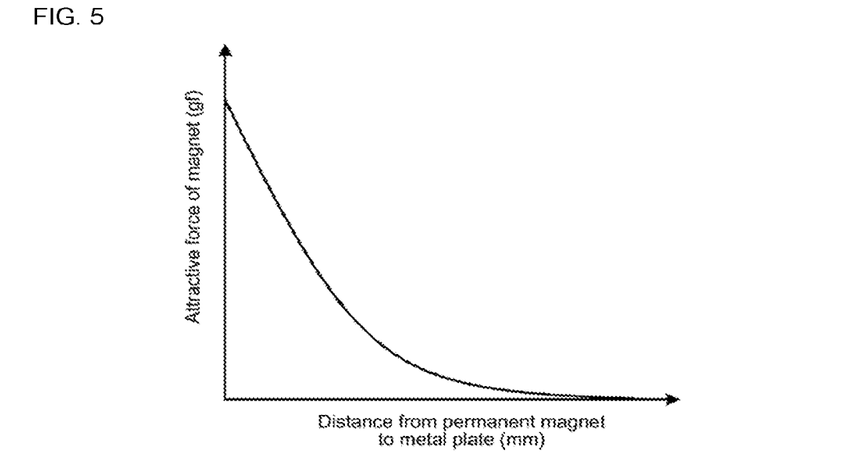
FIG. 5 A diagram showing the relationship between the distance from the permanent magnet to the metal plate and the attractive force of the permanent magnet.
Figure 6:
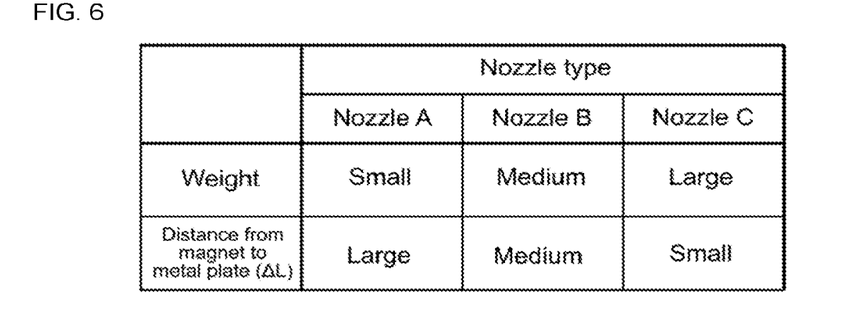
FIG. 6 A table showing the relationship between the weight of the nozzle and the distance from the permanent magnet to the metal plate.

Permanent magnet 44 embedded in head 40 and metal plate 58 embedded in nozzle 50 constitute a nozzle holding mechanism for holding nozzle 50 to head 40. The nozzle holding mechanism holds held surface 55 of nozzle 50 on holding surface 43 of head 40 by attracting metal plate 58 with the magnetic force of permanent magnet 44. As shown in FIG. 4, predetermined gap ΔL is formed between metal plate 58 and permanent magnet 44 in a state where nozzle 50 (nozzle flange 54) is held by head 40 (head flange 42). FIG. 5 is a diagram showing the relationship between the distance from the permanent magnet to the metal plate and the attractive force of the permanent magnet. FIG. 6 is a table showing the relationship between the weight of the nozzle and the distance between the permanent magnet and the metal plate. The holding force by which head 40 holds nozzle 50 is a force obtained by subtracting the gravity acting on nozzle 50 from the magnetic attractive force (hereinafter referred to simply as "attractive force") of permanent magnet 44 acting on metal plate 58. As shown in FIG. 5, the attractive force of permanent magnet 44 acting on metal plate 58 decreases as the distance between permanent magnet 44 and metal plate 58 increases. Further, as shown in FIG. 6, gap ΔL is set so as to become larger as the weight of the nozzle becomes smaller. Therefore, as the weight (gravity) of nozzle 50 attached to head 40 is smaller, the attractive force of permanent magnet 44 to nozzle 50 (metal plate 58) can be reduced, and the holding force of nozzle 50 can be made substantially uniform regardless of the type of nozzle 50 attached to head 40. The reason for this will be described later.

Figure 7A:
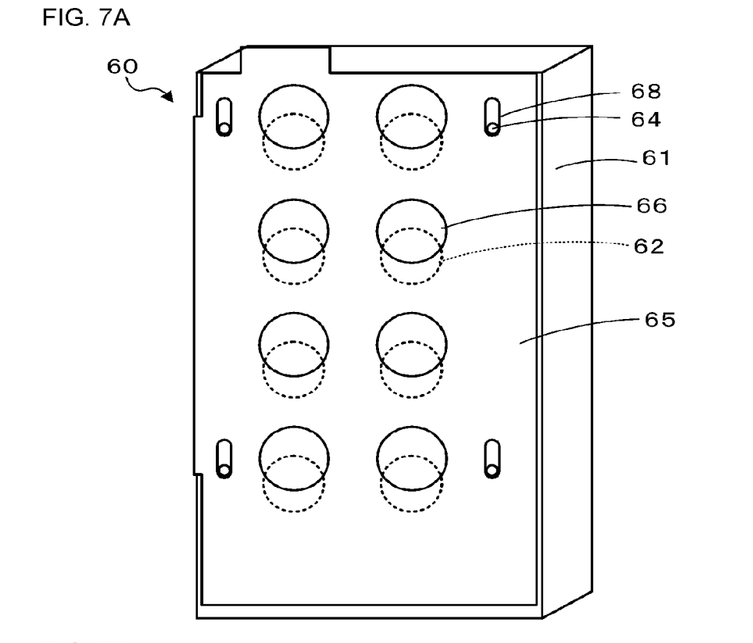
FIG. 7A A top view of shutter nozzle station 60.
Figure 7B:
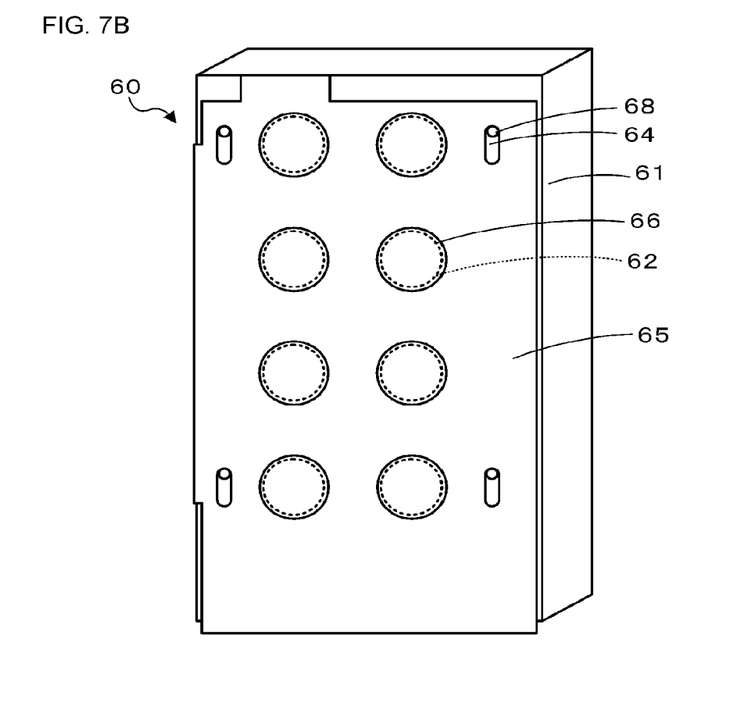
FIG. 7B A top view of shutter nozzle station 60.
Figure 8A:
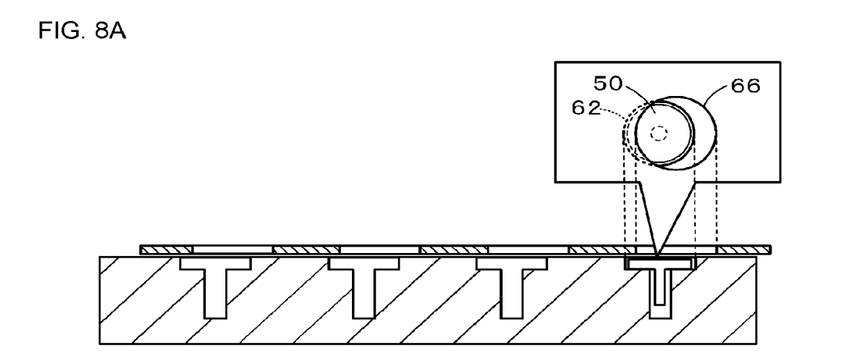
FIG. 8A A cross-sectional view of nozzle station 60.
Figure 8B:
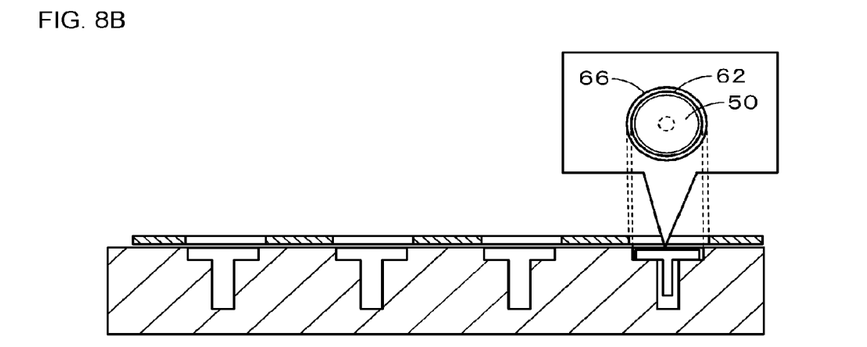
FIG. 8B A cross-sectional view of nozzle station 60.

Nozzle station 60 is for accommodating multiple types of nozzles 50 attachable to head 40. FIG. 7A, 7B are top views of shutter nozzle station 60. FIGS. 8A, 8B are cross-sectional views of nozzle station 60. Nozzle station 60 has nozzle station main body 61 and shutter 65 provided to cover the upper face of nozzle station main body 61. Nozzle station main body 61 has multiple accommodation holes 62 capable of accommodating nozzles 50. Shutter 65 has openings 66 having substantially the same diameter as that of accommodation holes 62 and the same spacing as that of accommodation holes 62, and slides by driving of shutter driving device 69 shown in FIG. 2. When shutter 65 slides to a position (i.e., a closed position) in which openings 66 are deviated with respect to accommodation holes 62, nozzles 50 cannot be inserted into or removed from accommodation holes 62, as shown in FIGS. 7A and 8A. Also, when shutter 65 slides to a position (i.e., an open position) where openings 66 completely overlap accommodation holes 62, nozzles 50 can be inserted into or removed from accommodation holes 62, as shown in FIGS. 7B and 8B. As shown in FIGS. 7A and 7B, guide pins 64 are provided upright at four corners of the upper face of nozzle station main body 61. Guide pins 64 engage with elongated guide holes 68 at the four corners of shutter 65. Guide pins 64 and guide holes 68 define the sliding direction and the sliding amount of shutter 65 so that shutter 65 can move between the open position and the closed position.

Mark camera 72 is attached to head 40 and captures an image of a reference mark attached to board S from above. Part camera 74 is installed between component supply device 22 and component conveyance device 24, and captures an image of a component from below when nozzle 50 holding the component passes above part camera 74.

Foreign-matter removal magnet 76 consists of a permanent magnet having a magnetic force stronger than that of permanent magnet 44, and is used to remove metallic foreign matter adhered to permanent magnet 44 by pulling off the foreign matter.

As shown in FIG. 2, mounting control device 80 is configured as a microprocessor centered on CPU 81, and includes, in addition to CPU 81, ROM 82 for storing process programs, HDD 83 for storing various data, RAM 84 used as a working area, input/output interface 85, and the like. Detection signals from X-axis position sensor 37, Y-axis position sensor 39, and Z-axis position sensor 46 that detect the positions of head 40 in the X-direction, Y-direction, and Z-direction, respectively, and detection signals from flow rate sensor 49b attached to negative pressure flow path 49a connected to negative pressure source 49 are inputted to mounting control device 80 via input/output interface 85. Image signals from mark camera 72 and part camera 74 are inputted to mounting control device 80 via input/output interface 85. Mounting control device 80 recognizes the position of board S by, for example, processing the image of board S captured by mark camera 72 and recognizing the position of a board mark (not shown). In addition, mounting control device 80 determines whether a component is picked up by nozzle 50 based on the image captured by part camera 74 and determines the suction position and suction orientation of the component. On the other hand, various drive signals to board conveyance device 24, X-axis motor 36, Y-axis motor 38, Z-axis motor 45, switching valve 47, and shutter driving device 69 are outputted from mounting control device 80 via output ports. Further, mounting control device 80 is connected to feeder control device 23 and management device 100 built in component supply device 22 (feeder), in a manner which allows bidirectional communication, and these items exchange data and control signals with each other.

As shown in FIG. 2, management device 100 includes main computer 102, input device 104, and display 106, and can input signals from input device 104 operated by an operator, and can output various images to display 106. Production job data is stored in the memory of main computer 102. The production job data defines which components are mounted on board S in what order in component mounting device 10 and how many boards S mounted in such a manner are produced.

Next, an operation in which mounting control device 80 of component mounting device 10 mounts a component on board S based on a production job (i.e., a component mounting operation) will be described. Mounting control device 80 causes nozzle 50 of head 40 to pick up a component supplied to the component supply position by component supply device 22. Specifically, mounting control device 80 causes X-axis motor 36 and Y-axis motor 38 to move nozzle 50 of head 40 directly above the component suction position of the component to be picked up. Next, mounting control device 80 controls Z-axis motor 45 to lower nozzle 50 and controls switching valve 47 to supply a negative pressure to air flow path 56 of nozzle 50. As a result, the component is picked up at the distal end of nozzle 50. Thereafter, mounting control device 80 causes Z-axis motor 45 to lift nozzle 50 and causes X-axis motor 36 and Y-axis motor 38 to move nozzle 50 having the component picked up to the tip thereof above a predetermined mounting position on board S. At the predetermined mounting position, mounting control device 80 then causes Z-axis motor 45 to lower nozzle 50 and controls switching valve 47 so that the positive pressure is supplied to air flow path 56. As a result, the component is mounted at the predetermined mounting position on board S by being separated from nozzle 50. Other components to be mounted on board S are similarly mounted on board S, and when mounting of all components is completed, board S is sent out to the downstream side.

Figure 9:
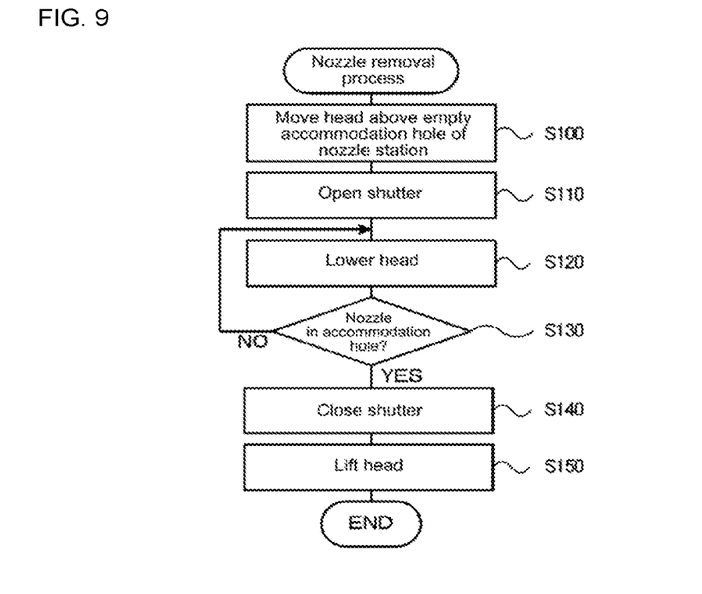
FIG. 9 A flow chart showing an example of a nozzle removal process.

Next, an operation in which mounting control device 80 of component mounting device 10 automatically exchanges nozzle 50 of head 40 will be described. Automatic exchanging of nozzles 50 involves performing a nozzle detaching operation of removing nozzles 50 held by head 40 and returning them to nozzle station 60, and a nozzle mounting operation of attaching nozzles 50, accommodated in nozzle station 60, to head 40. Hereinafter, the nozzle detaching operation will be described, and thereafter, the nozzle mounting operation will be described. FIG. 9 is a flow chart showing an example of the nozzle removal process.

Figure 10:
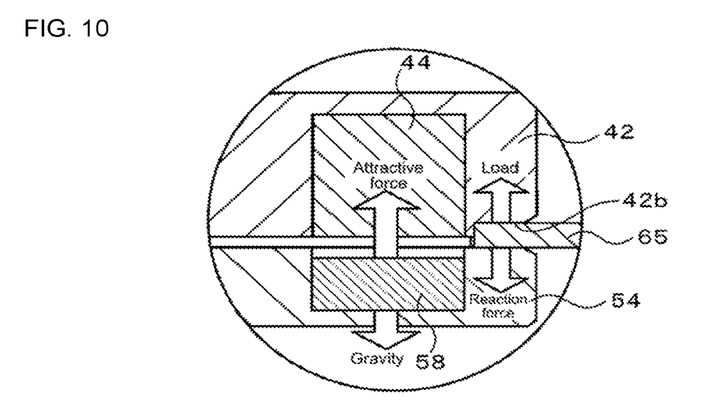
FIG. 10 A view showing a shutter reaction force required to peel off nozzle 50 from head 40.

When the nozzle removal process is executed, first, mounting control device 80 causes X-axis motor 36 and Y-axis motor 38 to move head 40 above an empty accommodation hole 62, in which nozzle 50 is not accommodated, among accommodation holes 62 of nozzle station 60 (S100). Next, mounting control device 80 controls shutter driving device 69 such that shutter 65 of nozzle station 60 slides to the open position (S110). Mounting control device 80 then causes Z-axis motor 45 to lower head 40 (S120) and determines whether nozzle 50 is accommodated in the empty accommodation hole 62 of nozzle station 60 (S130). The process of S130 can be performed, for example, by determining whether head 40 has reached a predetermined position with Z-axis position sensor 46, or by detecting that nozzle 50 has come in contact with the empty accommodation hole 62 with a touch-sensitive sensor (not shown) provided in head 40. When it is determined that nozzle 50 is accommodated in the empty accommodation hole 62 of nozzle station 60, mounting control device 80 causes shutter driving device 69 to slide shutter 65 into the closed position (S140). As a result, as shown in FIG. 10, the edge of opening 66 of shutter 65 enters a gap (annular groove 42b) between head flange 42 and nozzle flange 54. While in this state, mounting control device 80 then causes Z-axis motor 45 to lift head 40, thereby peeling nozzle 50 off of head 40 (S150) and completing the nozzle removal process. In this manner, when nozzle 50 is removed from head 40 and returned to nozzle station 60, mounting control device 80 peels off nozzle 50 from head 40 by closing shutter 65 of nozzle station 60 with nozzle 50 in the empty accommodation hole 62 and pulling up head 40 while shutter 65 pushes against nozzle 50. At this time, as shown in FIG. 10, when the sum of the reaction force acting on nozzle 50 by shutter 65, by pulling up head 40, and the gravity acting on nozzle 50 becomes larger than the attractive force acting on nozzle 50 by permanent magnet 44, nozzle 50 is peeled off from head 40. Here, in order to hold many types of nozzles with a sufficient holding force with one type of permanent magnet, a case is considered in which a permanent magnet having a strong magnetic force is used to match with a heavy nozzle. In this case, since a light nozzle is held by a permanent magnet having a strong magnetic force, a large reaction force of shutter 65 is required to remove the nozzle and, consequently, a large load is applied to shutter 65. As a countermeasure to this, in the present embodiment, clearance $\Delta L$ between permanent magnet 44 provided in head 40 and metal plate 58 provided in nozzle 50 is made to be larger as the weight of the nozzle decreases. Therefore, since the attractive force of permanent magnet 44 to metal plate 58 becomes larger for heavier nozzles and becomes smaller for lighter nozzles, it is possible to keep the reaction force required from becoming excessively large when light nozzles are peeled off from head 40 and returned to nozzle station 60 while sufficiently ensuring the holding force when heavy nozzles are held by head 40.

Figure 11:
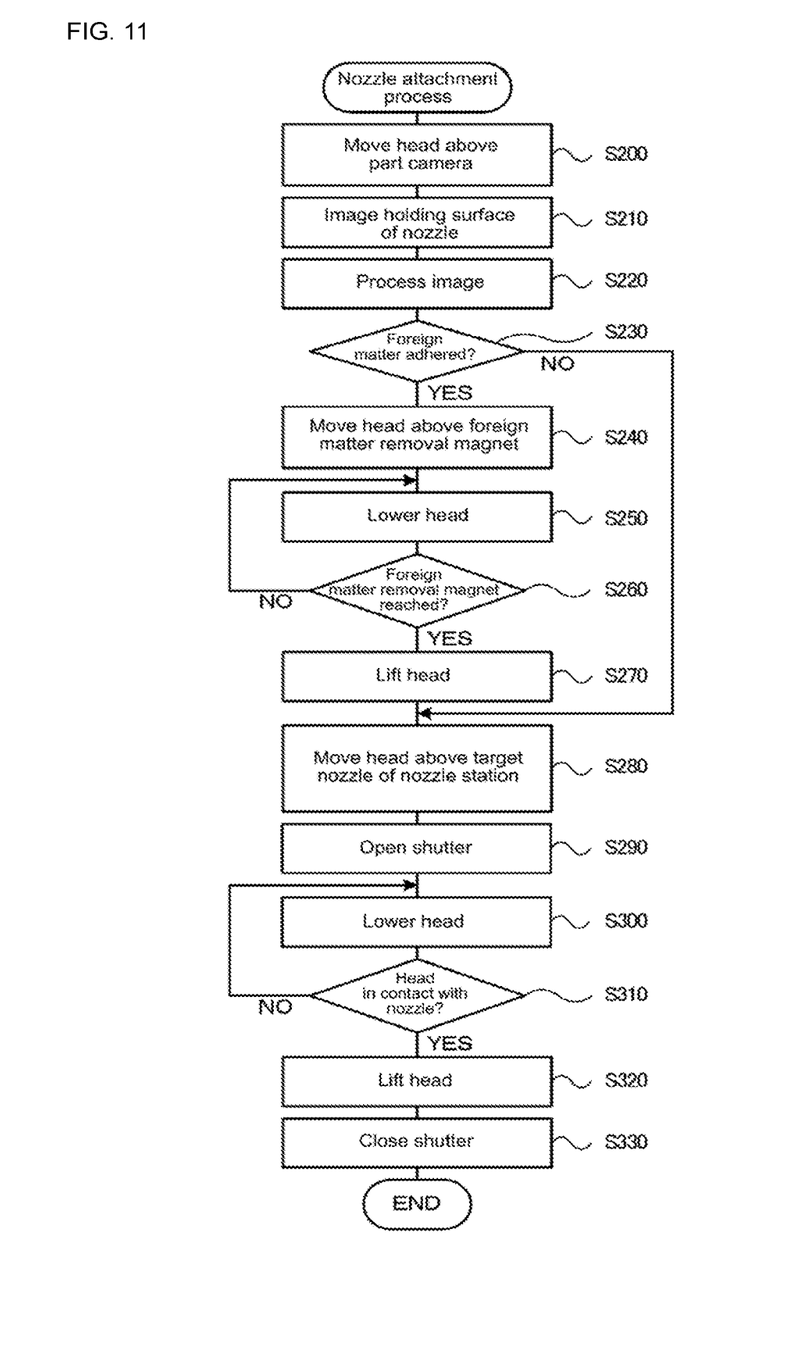
FIG. 11 A flow chart showing an example of a nozzle attachment process.

Next, the nozzle attachment process will be described. FIG. 11 is a flow chart showing an example of the nozzle attachment process. When the nozzle attachment process is performed, the mounting control device 80 controls X-axis motor 36 and Y-axis motor 38 such that head 40 is moved above part camera 74 (S200). Next, holding surface 43 of head 40 is imaged by part camera 74 (S210), and the obtained image is processed to determine whether any metallic foreign matter is adhered to permanent magnet 44 (S220). Specifically, mounting control device 80 detects the color of the permanent magnet from the captured image, extracts the contour of the detected color, and compares the contour of the extracted color with the contour of the actual permanent magnet. Mounting control device 80 then determines that foreign matter is not adhered to permanent magnet 44 if the contours of the both are the same, while determines that foreign matter is adhered to permanent magnet 44 if the contours are different. When it is determined that foreign matter is adhered to permanent magnet 44 ("YES" in S230), mounting control device 80 controls X-axis motor 36 and Y-axis motor 38 such that head 40 moves above foreign-matter removal magnet 76 (S240). Next, mounting control device 80 causes Z-axis motor 45 to lower head 40 (S250) and determines whether permanent magnet 44 of head 40 has been pressed against foreign-matter removal magnet 76 (S260). The process of S260 can be performed, for example, by determining whether head 40 has reached a predetermined position with Z-axis position sensor 46, or by detecting whether head 40 has come into contact with foreign matter removal magnet 76 with a touch-sensitive sensor. When permanent magnet 44 is pressed against foreign-matter removal magnet 76, mounting control device 80 causes Z-axis motor to lift 45 head 40 (S270) and proceeds to the process of S280. As a result, the metallic foreign matter adhered to permanent magnet 44 is pulled off by foreign-matter removal magnet 76 which is stronger than permanent magnet 44. On the other hand, when it is determined that no foreign matter is adhered to permanent magnet 44 ("NO" in S230), mounting control device 80 skips the processes of S240 to S270 and then proceeds to the process of S280.

Next, mounting control device 80 causes X-axis motor 36 and Y-axis motor 38 to move head 40 above accommodation hole 62 in which nozzle 50 (target nozzle) to be mounted is accommodated among accommodation holes 62 of nozzle station 60 (S280). Next, mounting control device 80 controls shutter driving device 69 such that shutter 65 of nozzle station 60 slides to the open position (S290). Mounting control device 80 then causes Z-axis motor 45 to lower head 40 (S300) and determines whether head 40 has come into contact with nozzle 50 (S310). The process of S310 can be performed, for example, by determining whether head 40 has reached a predetermined position with Z-axis position sensor 46, or by detecting whether head 40 has come into contact with nozzle 50 with a touch-sensitive sensor. When it is determined that head 40 is in contact with nozzle 50, mounting control device 80 causes Z-axis motor 45 to lift head 40 (S320), causes shutter driving device 69 to slide shutter 65 to the closed position (S330), and ends the nozzle attachment process.

Here, the correspondence between the main elements of the embodiments and the main elements of the present disclosure will be described. That is, component mounting device 10 corresponds to a component mounting device, head 40 corresponds to a head, nozzle 50 corresponds to a nozzle, permanent magnet 44 corresponds to a magnet, and metal plate 58 corresponds to a magnetic material. Further, XY robot 30 (X-axis motor 36 and Y-axis motor 38) and Z-axis motor 45 correspond to a moving device, foreign-matter removal magnet 76 corresponds to a strong magnet, and mounting control device 80 corresponds to a control device. Further, part camera 74 corresponds to an imaging device.

The head holding mechanism in the component mounting device of the embodiment described above holds nozzle 50 to head 40 by attracting metal plate 58 provided in nozzle 50 with permanent magnet 44 provided in head 40. Gap $\Delta L$ is formed between permanent magnet 44 and metal plate 58 while nozzle 50 is held by head 40. Gap $\Delta L$ is adjusted so as to be larger as the weight of the nozzle, among the multiple types of nozzles that can be attached to head 40, decreases. With this configuration, it is possible to increase the magnetic attractive force acting on heavier nozzles and to decrease the magnetic attractive force acting on lighter nozzles. As a result, it is possible to prevent nozzles from falling regardless of the type of nozzle attached to head 40, and nozzles can be easily removed when nozzles are exchanged.

Before attaching nozzle 50 to head 40, the component mounting device of the embodiment determines whether foreign matter is adhered to permanent magnet 44 of head 40. When it is determined that foreign matter is adhered to permanent magnet 44, permanent magnet 44 is pressed against foreign-matter removal magnet 44 having a higher magnetic force than permanent magnet 44 and foreign matter is pulled off. As a result, it is possible to automatically remove foreign matter adhering to permanent magnet 44 and attach nozzle 50, thereby preventing a failure in attaching nozzle 50.

The present disclosure is not limited in any way to the above-mentioned embodiments, and it is needless to say that the present disclosure can be implemented in various forms as long as they fall within the technical scope of the disclosure of the present disclosure.

For example, in the embodiment described above, before nozzle 50 is attached to head 40, component mounting device 10 determines whether foreign matter is adhered to permanent magnet 44 by imaging holding surface 43 of head 40 with part camera 74. However, component mounting device 10 may determine whether foreign matter is adhered to permanent magnet 44 based on a flow rate of air flowing through negative pressure flow path 49*a* when negative pressure is supplied from negative pressure source 49 to nozzle 50 (air flow path 56) while nozzle 50 is held by head 40. In this case, mounting control device 80 executes the component mounting process of FIG. 12 instead of the component mounting process of FIG. 11.

Figure 12:
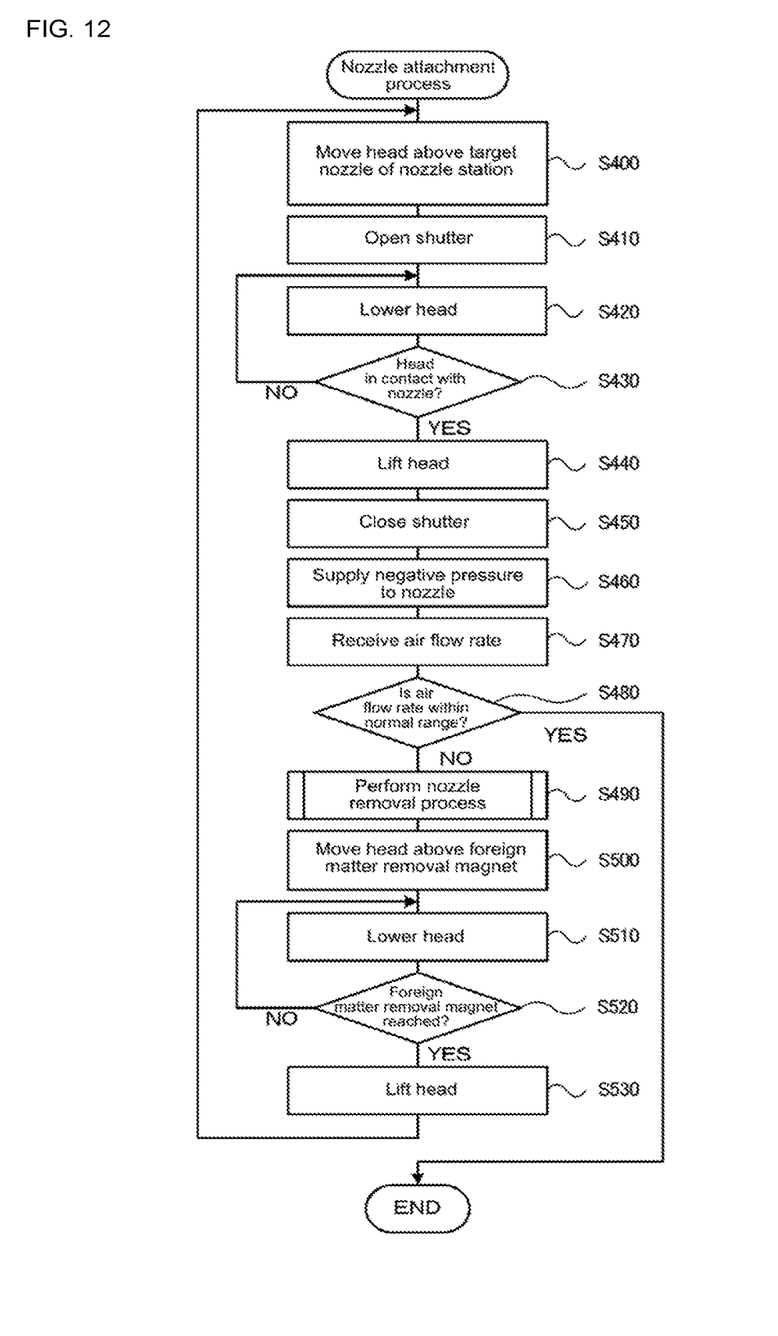
FIG. 12 A flow chart showing a nozzle attachment process in another embodiment.

In the component mounting process of FIG. 12, mounting control device 80 executes the same processes as in S280 to S330 of the component mounting process of FIG. 11, and mounts nozzle 50 to head 40 (S400 to S450). Next, mounting control device 80 controls switching valve 47 so as to supply negative pressure to air flow path 56 of nozzle 50 (S460). Mounting control device 80 then receives the air flow rate from flow rate sensor 78 (S470) and determines whether the received air flow rate is within a normal range (S480). Here, the normal range is a range of the air flow rate flowing through negative pressure flow path 49a when negative pressure is supplied to air flow path 56 of nozzle 50 while no foreign matter is adhered to permanent magnet 44 and nozzle 50 is attached to head 40 in a normal manner, and the normal range is determined in advance by an experiment or the like. When it is determined that the air flow rate is within the normal range, mounting control device 80 determines that nozzle 50 is properly mounted to head 40 and ends the nozzle attachment process. On the other hand, when it is determined that the air flow rate is not within the normal range, mounting control device 80 determines that foreign matter may be adhered to permanent magnet 44 and first performs a nozzle removal process similar to the nozzle removal process shown in FIG. 9 (S490). Mounting control device 80 then executes the foreign-matter removal process in S240 to S270 of the nozzle attachment process shown in FIG. 11 (S500 to S530), and returns to the process of S400 to repeat the process. Note that mounting control device 80 may output an error when the air flow rate does not fall within the normal range despite repeating such processes a predetermined number of times.

In the embodiment described above, when returning nozzle 50 to nozzle station 60, mounting control device 80 removes nozzle 50 from head 40 by inserting nozzle 50 into accommodation hole 62, closing shutter 65, and peeling off nozzle 50 from head 40 while shutter 65 pushes against nozzle 50. However, the head may be provided with an air blowing hole capable of blowing air toward the attaching surface of the nozzle. In this case, when returning the nozzle to the nozzle station, the mounting control device removes the nozzle from the head against the attractive force of the permanent magnet by inserting the nozzle into the accommodation hole and peeling off the head while blowing air from the air blowing hole toward the attaching surface of the nozzle. By making the holding force of the nozzle (metal plate) by the permanent magnet substantially constant regardless of the type of the nozzle, the nozzle can be more reliably peeled off from the head without excessively increasing the amount of blowing air.

INDUSTRIAL APPLICABILITY

The present disclosure can be applied to a manufacturing industry of a component mounting device and the like.

REFERENCE SIGNS LIST

10 Component mounting device, 12 Housing, 22 Component supply device, 23 Feeder control device, 24 Board conveyance device, 25 Conveyor rail, 26 Conveyor belt, 28 Support pin, 30 XY robot, 31 Guide rail, 32 X-axis slider, 33 Guide rail, 34 Y-axis slider, 36 X-axis motor, 37 X-axis position sensor, 38 Y-axis motor, 39 Y-axis position sensor, 40 Head, 42 Head flange, 42a Recess, 42b Annular groove, 43 Holding surface, 44 Permanent magnet, 45 Z-axis motor, 46 Z-axis position sensor, 47 Switching valve, 48 Positive pressure source, 49 Negative pressure source, 49a Negative pressure flow path, 49b Flow rate sensor, 50 Nozzle, 52 Nozzle main body, 54 Nozzle flange, 55 Held surface, 56 Air flow path, 58 Metal plate, 60 Nozzle station, 61 Nozzle station main body, 62 Accommodation hole, 64 Guide pin, 65 Shutter, 66 Opening, 68 Guide hole, 69 Shutter driving device, 72 Mark camera, 74 Part camera, 76 Foreign-matter removal magnet, S Board, 80 Mounting control device, 81 CPU, 82 ROM, 83 HDD, 84 RAM, 85 Input/output interface, 100 Management device, 102 Main computer, 104 Input device, 106 Display.

The invention claimed is:

1. A nozzle holding mechanism comprising:
a head configured to hold multiple types of nozzles;
a magnet provided in a holding section of the head; and
a magnetic material, being attracted to the magnet, and provided in a held section of a nozzle of the multiple types of nozzles on a side held by the holding section of the head, at a position facing the magnet,
wherein the magnetic material is provided so as to have a gap between the magnetic material and the magnet while the nozzle is held by the head, the gap is larger or smaller in accordance with a type of the nozzle held by the head, and the gap is larger as weight of the nozzle decreases.

2. A component mounting device comprising:
the nozzle holding mechanism according to claim 1;
a robot configured to move the head;
a strong magnet having a magnetic force stronger than the magnet; and
processing circuitry configured to determine whether foreign matter is adhered to the magnet provided in the holding section of the head, and in a case in which it is determined that the foreign matter is adhered to the magnet, control the robot such that the foreign matter is pulled off by the strong magnet.

3. The component mounting device of claim 2, further comprising:
a camera to capture an image of the holding section of the head,
wherein the processing circuitry captures an image of the holding section of the head with the camera before holding the nozzle to the head, and determines whether the foreign matter is adhered to the magnet based on the image obtained by the imaging.

4. The component mounting device of claim 2, further comprising:
a negative pressure flow path for supplying negative pressure to a suction port of the nozzle; and
a flow rate sensor provided in the negative pressure flow path,
wherein the processing circuitry determines whether the foreign matter is adhered to the magnet based on a flow rate detected by the flow rate sensor while the nozzle is held by the head.

* * * * *